(12) United States Patent
Polvi

(10) Patent No.: US 6,772,936 B2
(45) Date of Patent: Aug. 10, 2004

(54) METHOD FOR MAKING AN ELECTROCONDUCTIVE JOINT

(75) Inventor: Veikko Polvi, Pori (FI)

(73) Assignee: Outokumpu Oyj, Espoo (FI)

(*) Notice: Subject to any disclaimer, the term of this patent is extended or adjusted under 35 U.S.C. 154(b) by 0 days.

(21) Appl. No.: 10/239,322

(22) PCT Filed: Mar. 21, 2001

(86) PCT No.: PCT/FI01/00281

§ 371 (c)(1),
(2), (4) Date: Sep. 18, 2002

(87) PCT Pub. No.: WO01/71852

PCT Pub. Date: Sep. 27, 2001

(65) Prior Publication Data

US 2003/0038165 A1 Feb. 27, 2003

(30) Foreign Application Priority Data

Mar. 21, 2000 (FI) .............................. 20000657

(51) Int. Cl.⁷ .................... B23K 35/12; B23K 31/02
(52) U.S. Cl. ................... 228/246; 228/119; 148/528; 428/620
(58) Field of Search ................. 228/119, 111.5, 228/246, 256, 264; 148/528; 428/620

(56) References Cited

U.S. PATENT DOCUMENTS

| | | | |
|---|---|---|---|
| 3,883,946 A | * 5/1975 | Dale | ........................... 228/121 |
| 4,497,430 A | 2/1985 | Bose et al. | |
| 4,678,720 A | 7/1987 | Hsu et al. | |
| 5,028,495 A | * 7/1991 | Hirano et al. | ............... 428/622 |
| 6,047,876 A | * 4/2000 | Smith | ...................... 228/111.5 |
| 6,386,426 B1 | * 5/2002 | Tadauchi et al. | ............ 228/117 |
| 6,469,242 B1 | * 10/2002 | Kondo | ........................ 136/251 |
| 6,651,870 B2 | * 11/2003 | Teshima et al. | ............ 228/246 |
| 2003/0010410 A1 | * 1/2003 | Polvi et al. | ................. 148/528 |
| 2003/0020215 A1 | * 1/2003 | Polvi | ........................... 266/259 |

FOREIGN PATENT DOCUMENTS

| | | |
|---|---|---|
| DE | 3930859 | 4/1990 |
| EP | 0831565 | 3/1998 |

* cited by examiner

*Primary Examiner*—L. Edmondson
(74) *Attorney, Agent, or Firm*—Morgan & Finnegan, LLP

(57) ABSTRACT

A method for creating an electroconductive joint in connection with conductor rails made of copper or copper alloy, in which method in between the conductor rail elements to be joined, there is applied soldering/brazing agent, whereafter at least the junction area is heated, so that a joint is created. According to the method, the employed soldering/brazing agent is a layered soldering/brazing agent foil (3) comprising surface layers (4, 6) and an intermediate layer (5) therebetween, and the junction area is thermally treated, so that a diffusion joint is created.

12 Claims, 1 Drawing Sheet

METHOD FOR MAKING AN ELECTROCONDUCTIVE JOINT

Figure 1:
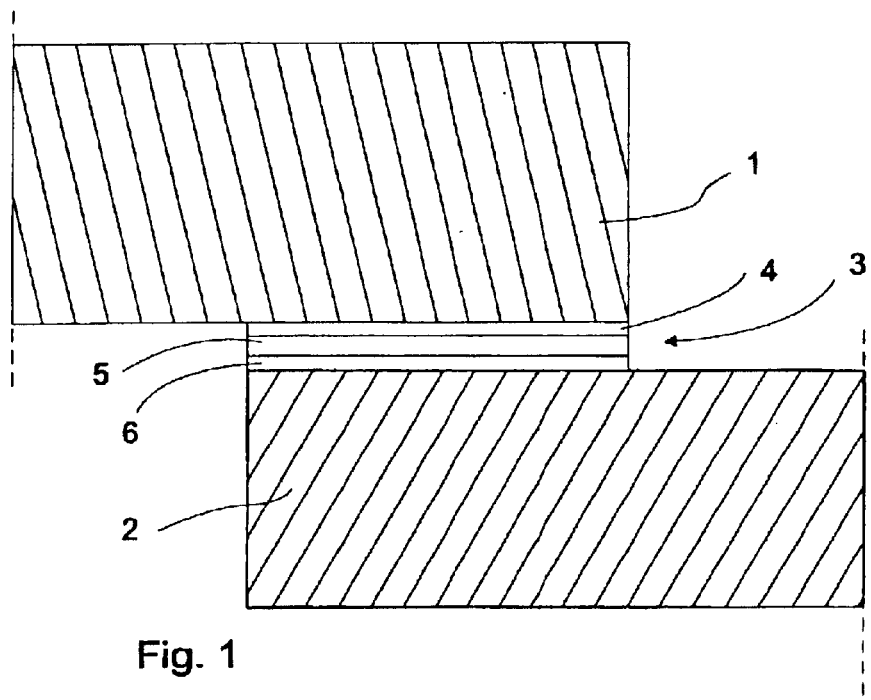

The present invention relates to a method according to the preamble of the appended claim 1.

In plants requiring high electric power, the employed power conductors are typically conductor rails made of copper or copper alloy. The conductor rails are long and typically include clamp joints created by means of fastening means, such as bolts. Usually the joints are overlapping joints, in which case through the pieces to be joined together, there is drilled at least one hole in the transversal direction. The holes are arranged to match, and therethrough there is inserted a fastening element, such as a bolt, which is tightened by means of a counterpart, such as a nut, so that the joint surfaces of the pieces to be joined are pressed together. While applying a bolt joint, the conduction of the electric current depends on the mechanical contact between the joined pieces. An effective and safe power conduction is secured only when the mechanical joint is in order. Clamp joints are typically oxidized in the course of time, in which case in the junctions there are created transfer resistances that consume an unnecessary high amount of electric power. Heavily power-consuming units for instance in the metallurgic industry are, among others, electrolytic plants and process-metallurgic electric furnaces. Owing to a weakening in the electroconductive capacity of bolt joints and to the creation of transfer resistances, remarkable economical losses are caused because of an increased energy consumption. Moreover, reparations of the joints, where even ten-year-old joints should be renewed, result in high work expenses.

The object of the invention is to realize a method and a joint whereby the drawbacks of the prior art can be avoided. Another object of the invention is to realize a method whereby it is possible, apart from making new joints, also repair old joints.

The invention is characterized in what is specified in the appended claims.

The arrangement according to the invention has several remarkable advantages. By applying the method according to the invention, there are achieved extremely durable and long-lasting joints with an electroconductive capacity that remains excellent. The method according to the invention is fairly easily applied in connection with different conductor rail arrangements. The joint is quickly made, and the method can be applied in various different installation conditions. By means of an embodiment of the method according to the invention, existing mechanical joints that are in poor condition can be easily repaired. By employing layer foil as the soldering/brazing agent, there is achieved an extremely advantageous soldering/brazing agent combination, which is easily applicable to use. When the method according to the invention is applied in repairing old joints, the old bolt joint can be left in place and bypassed by using a conductive element, which is for instance hard soldered on both sides of the old junction.

When the joining materials required for a diffusion joint are used in sufficiently thin and optimized layers, it is possible, even at low working temperatures, to obtain, by means of diffusion mechanisms, in the final joint structure such solid phases that have a melting temperature even hundreds of degrees higher than the melting temperature of the original joint material. Thus the joint is in a way self-correcting, because it endures higher temperatures than a pure joint material would endure. The heat required by the diffusion mechanisms between the joint material and the objects to be joined can be brought in the process by heating with a heating device, for example by a liquid gas burner. Other suitable heating arrangements, such as induction heating, can also be used for heating the junction area. On the surface of the soldering/brazing agent foil and/or at least in on of the surfaces to be joined, there is applied a layer of tin (Sn) prior to making the joint. The feeding of tin lowers the temperature required for making the joint. In addition, the oxidation of the surfaces to be joined is avoided, and protective gas arrangements are not needed in connection with the making of the joint. In order to start the phase transition reactions and to achieve an optimal structure in the joint seam, it suffices to have a tin layer of a few micrometers as the surface layer of the soldering/brazing agent in between the Ag+Cu center layer and the object to be joined. The technique according to the method is not critical for the Ag+Cu composition, in which case even essentially pure Ag foil can be used. The creation of the joint takes place rapidly as a result from the molten and solid material diffusion and the successive phase transition reactions, even at relatively low temperatures. By applying a preferred embodiment of the method of the invention, soldering/brazing agents resistant to very different oxidizing conditions have been created. With respect to corrosion taking place in the working conditions, the tin in the created mosaic gold is not harmful, because it is not sulfatized in the same fashion as zinc and copper. As for the silver that is dissolved in the phases of the junction seam, it helps to improve the corrosion resistance of the mosaic gold. By applying the method, there are obtained extremely good joints that maintain their electroconductive capacity and are well suited to the conductor rail arrangements in plants that use an extremely high electric power.

Figure 2:
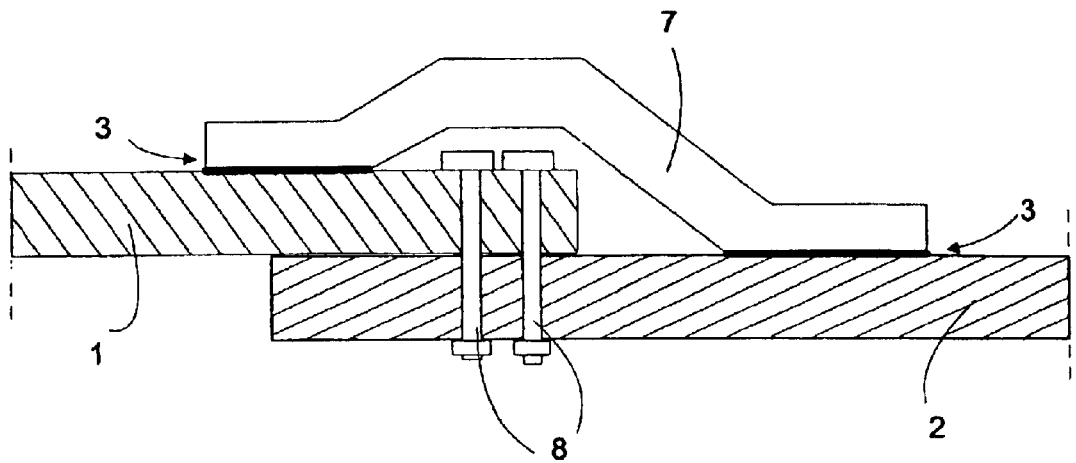

The invention is explained in more detail below, with reference to the appended drawings, where FIG. 1 illustrates a joint according to the invention, seen in cross-section prior to the thermal treatment, and FIG. 2 illustrates another embodiment of the method according to the invention.

In the method according to the invention, a conductor rail 1, essentially made of mainly copper, is joined to another conductor rail 2 mainly made of copper. According to the method, in between the junction surfaces of the conductor rails, there is fed soldering/brazing agent 3 with a melting temperature that is lower than the melting temperature of the parts 1, 2 to be joined together; at least the junction area is heated at least up to the melting temperature of part of the soldering/brazing agent or up to the vicinity thereof, whereafter the junction area is cooled down. By means of the method according to the invention, there is achieved a diffusion joint. The temperature can be raised up to the described high level so that in the junction zone, there is temporarily created a molten phase. The employed soldering/brazing agent is layered soldering/brazing agent foil 3, which comprises surface layers 4, 6, and an intermediate layer 5 therebetween. According to the method, the junction area is heated so that a diffusion joint is created.

The soldering/brazing agent is easy to handle in sheets that are suitably wide and cut to the correct length, and it can be installed in advance at exactly the desired spot in the joint, in which case extremely good joints are achieved throughout the whole area of the junction surface. The soldering/brazing agent foil is placed in between the pieces 1, 2 to be joined together, so that the soldering/brazing agent 3, together with the pieces to be joined, forms a layered structure. In the case of FIG. 1, the proportions are adjusted for the sake of clarity, so that the soldering/brazing agent 3 is illustrated as remarkably thicker than in the reality.

The intermediate layer 5 of the soldering/brazing agent is chosen from the following group: a mixture of silver and copper (Ag+Cu), a mixture of aluminum and copper (Al+Cu) or a mixture of tin and copper (Sn+Cu). With respect to their melting behavior, the compounds of the soldering/brazing agent advantageously form eutectic compositions with copper. For instance with a silver-and-copper soldering/brazing agent, the eutectic composition includes 71% by weight silver (Ag) and 29% by weight copper (Cu). The soldering/brazing agents can also be pure silver (Ag) or aluminum (Al).

The surface layers 4, 6 of the soldering/brazing agent foil 3 comprise tin (Sn) or some other metal that is dissolved in copper and has a low melting temperature, whereby the temperature required for the soldering/brazing operation can be lowered. The surface layers 4, 6 can be formed for example by immersing the soldering/brazing agent constituting the intermediate layer 5 of the foil in molten tin, and when necessary, by rolling the foil smooth after that.

Extremely high-quality joints have been achieved by using, according to the method, a layered soldering/brazing agent foil 3, with an intermediate layer 5 comprising silver and copper (Ag+Cu) and having a thickness of 50 μm, and with surface layers 4, 6 comprising tin (Sn) and having a thickness of for instance 5–10 μm. The thickness of the soldering/brazing agent foil is typically 10–500 μm, advantageously 20–100 μm. When tin layers are applied on the surface, the thickness of the intermediate layer 5 of the foil is 10–100 μm and the thicknesses of the surface layers 4, 6 are 1–20 μm.

When a tin layer is employed as the surface layers 4, 6, in connection with soldering/brazing there can also be used an intermediate layer with a copper content that is lower than in the eutectic composition. For instance the copper content of the Ag+Cu soldering/brazing agent can also be 0–29% by weight. When tin layers are used, the composition is not critical for the method.

In FIG. 2, there is illustrated another embodiment according to the method of the invention, where beside an old bolt joint 8, there is made a new joint that has an essentially better electroconductive capacity than the old joint. In this embodiment, there is used a conductor element 7, the first end whereof is connected to the first part 1 of the joint to be repaired, and the second end is connected to the second part 2 of the joint to be repaired. The conductor element 7 is connected to the first part and/or to the second part by means of a diffusion joint 3. The conductor element is designed in a way that is suitable for the joint. Typically the joint is made by means of hard soldering/brazing, by using a layered soldering/brazing foil.

EXAMPLE I

In this example, a copper object was joined with another copper object by an Ag+Cu soldering/brazing agent comprising, in percentages by weight, 71% Ag and 29% Cu. The soldering/brazing agent was applied in the form of foil with a thickness of 50 μm, and in addition, on the foil surface there was made a tin layer with a thickness of the order 5–10 μm. The temperature was raised up to about 600° C. The holding time was about 5 minutes. The joint according to the example succeeded excellently. There was achieved a compact and smooth joint, where the tin, which was originally contained as an essentially pure element, formed a mosaic gold seam with the copper.

By means of the method according to the invention, there can be joined conductor rails with junction surfaces that are made of copper and/or copper alloys, typically with a copper content of at least 50%.

What is claimed is:

1. A method for creating an electroconductive joint in connection with conductor rails made of copper or copper alloy, comprising applying soldering agent in between the conductor rail elements to be joined, then heating at least the junction area, so that a joint is created, wherein the employed soldering agent is a layered soldering agent foil comprising surface layers formed of tin (Sn) or a metal other than tin, that dissolves well in copper and has a melting temperature that is lower than the melting temperature of the conductor rail elements to be joined, and an intermediate layer therebetween having an eutectic composition with copper, said intermediate layer of the soldering agent being selected from the group consisting of essentially silver, a mixture of silver and copper (Ag+Cu), a mixture of aluminum and copper (Al+Cu) and a mixture of tin and copper (Sn+Cu), and thermally treating the junction area so that a diffusion joint is created.

2. A method according to claim 1, wherein the surface layer is formed of tin, the intermediate layer of the soldering agent is a mixture of silver and copper (Ag+Cu), and the copper content of the intermediate layer is between 0% and 29% by weight, the balance being silver.

3. A method according to claim 1, wherein the intermediate layer of the soldering agent comprises, in percentages by weight, about 71% silver (Ag) and about 29% copper (Cu).

4. A method according to claim 1, wherein the intermediate layer of the soldering agent consists essentially of silver (Ag).

5. A method for creating an electroconductive joint in connection with conductor rails made of copper or copper alloy, comprising applying soldering agent in between the conductor rail elements to be joined, then heating at least the junction area, so that a joint is created, wherein the employed soldering agent is a layered soldering agent foil comprising surface layers formed of tin (Sn) or a metal other than tin, that dissolves well in copper and has a melting temperature that is lower than the melting temperature of the conductor rail elements to be joined, and an intermediate layer therebetween having an eutectic composition with copper, said intermediate layer of the soldering agent consisting essentially of aluminum (Al), and thermally treating the junction area so that a diffusion joint is created.

6. A method according to claim 1, wherein the soldering agent foil has a thickness of about 10–500 μm.

7. A method according to claim 6, wherein the intermediate layer of the soldering agent has a thickness of 10–100 μm and the surface layers have a thickness of 1–20 μm.

8. A method for creating an electroconductive joint to be applied particularly in connection with the reparations of conductor rail joints made of copper or copper alloy, comprising applying soldering agent in between the elements to be joined, thereafter heating at least the junction area, so that a joint is created, wherein in the method, introducing a conductor element that bypasses the junction spot to be repaired, connecting the first end of said element to the first part of the joint to be repaired, and connecting the second end of said element to the second part of the joint to be repaired, and connecting the conductor element to the parts by means of a diffusion joint, by applying, between the parts to be joined, a layered soldering agent foil comprising surface layers and an intermediate layer provided therebetween.

9. A method according to claim 6, wherein the soldering agent foil has a thickness of about 20–100 μm.

10. A method according to claim 5, wherein the soldering agent foil has a thickness of about 10–500 μm.

11. A method according to claim 10, wherein the intermediate layer of the soldering agent has a thickness of 10–100 $\mu$m and the surface layers have a thickness of 1–20 $\mu$m.

12. A method according to claim 10, wherein the soldering agent foil has a thickness of about 20–100 $\mu$m.

* * * * *